United States Patent
Pril et al.

(10) Patent No.: US 6,747,729 B2
(45) Date of Patent: Jun. 8, 2004

(54) LITHOGRAPHIC PROJECTION APPARATUS, DEVICE MANUFACTURING METHOD, DEVICE MANUFACTURED THEREBY AND GAS COMPOSITION

(75) Inventors: Wouter Onno Pril, Eindhoven (NL); Philip Dennis Henshaw, Carlisle, MA (US); Engelbertus Antonius Fransiscus Van De Pasch, Oirschot (NL); Marcel Hendrikus Maria Beems, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 298 days.

(21) Appl. No.: 09/899,566

(22) Filed: Jul. 6, 2001

(65) Prior Publication Data

US 2002/0045113 A1 Apr. 18, 2002

Related U.S. Application Data

(60) Provisional application No. 60/297,432, filed on Jun. 13, 2001.

(30) Foreign Application Priority Data

Jul. 14, 2000 (EP) ............................................. 00306022

(51) Int. Cl.$^7$ ............................. G03B 27/52; G03B 27/42
(52) U.S. Cl. ............................................. 355/30; 355/53
(58) Field of Search ............................ 355/30, 53, 67, 355/73, 75, 76, 77; 356/487; 359/507, 509, 665, 667

(56) References Cited

U.S. PATENT DOCUMENTS

| | | | | | |
|---|---|---|---|---|---|
| 5,025,284 | A | * | 6/1991 | Komoriya et al. | 355/53 |
| 5,559,584 | A | * | 9/1996 | Miyaji et al. | 355/73 |
| 5,991,033 | A | * | 11/1999 | Henshaw et al. | 356/487 |
| 6,411,368 | B1 | * | 6/2002 | Matsumoto et al. | 355/67 |

\* cited by examiner

*Primary Examiner*—Rodney Fuller
(74) *Attorney, Agent, or Firm*—Pillsbury Winthrop LLP

(57) ABSTRACT

A lithographic projection apparatus which uses one, and optionally also two or more color interferometric devices to accurately determine the position of a movable table within the apparatus. The apparatus comprises a purge gas source to supply purge gas to a space accommodating at least a part of said movable table, the purge gas being selected such that leakage of the purge gas into the area of operation of the interferometric devices does not cause significant error in the interferometric measurements.

31 Claims, 2 Drawing Sheets

LITHOGRAPHIC PROJECTION APPARATUS, DEVICE MANUFACTURING METHOD, DEVICE MANUFACTURED THEREBY AND GAS COMPOSITION

This application claims priority to U.S. Provisional Patent Application 60/297,432, filed Jun. 13, 2001, herein incorporated by reference.

BACKGROUND OF THE INVENTION

1. Field of the Invention

The present invention relates generally to lithographic projection apparatus and particularly to lithographic projection apparatus including an interferometer.

2. Description of the Related Art

The term "patterning structure" should be broadly interpreted as referring to means that can be used to endow an incoming radiation beam with a patterned cross-section, corresponding to a pattern that is to be created in a target portion of the substrate; the term "light valve" has also been used in this context. Generally, the said pattern will correspond to a particular functional layer in a device being created in the target portion, such as an integrated circuit or other device (see below). Examples of such patterning structure include:

- A mask table for holding a mask. The concept of a mask is well known in lithography, and its includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. The mask table ensures that the mask can be held at a desired position in the incoming radiation beam, and that it can be moved relative to the beam if so desired.
- A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.
- A programmable LCD array. An example of such a construction is given in U.S. Pat. No. 5,229,872, which is incorporated herein by reference.

For purposes of simplicity, the rest of this text may, at certain locations, specifically direct itself to examples involving a mask table and mask; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

To reduce the size of features that can be imaged, it is desirable to reduce the wavelength of the illumination radiation. Wavelengths of less than 180 nm are therefore employed, for example 157 nm or 126 nm. However, such wavelengths are strongly absorbed by normal atmospheric air leading to unacceptable loss of intensity as the beam traverses the apparatus. In order to solve this problem, it has previously been proposed to flush the apparatus with a flow of gas, the gas being substantially transparent to the illumination wavelength, e.g. nitrogen ($N_2$).

Lithographic projection apparatus may comprise interferometric displacement measuring means, which are used to accurately determine the position of movable tables, such as mask or substrate tables. These means measure the optical path length (geometrical distance×refractive index) to the movable tables using measurement beams of coherent monochromatic radiation. The measuring means are very sensitive to variations in pressure and temperature and in the composition of the medium that the measurement beams traverse through. All three of these variables affect the refractive index of the medium. Typically, in order to account for the variations in refractive index caused by temperature and pressure fluctuations, a second harmonic interferometric device is used. More information with regard to such second harmonic interferometric devices which are capable of compensating for temperature and pressure fluctuations, can be found, for example, in U.S. Pat. No. 5,404,222, which is incorporated herein by reference.

The second harmonic interferometer can, alternatively, compensate for variations in the composition of the medium. However, this second interferometric device cannot simultaneously account for the variations in pressure and temperature and in the composition of the medium.

Some spaces of the projection apparatus may be flushed with a purge gas in order to remove any gas, such as oxygen or water, which absorbs radiation at the wavelength of the projection beam of radiation. The inventors have found that if the gas used to purge the system enters the area where the interferometric displacement measuring means operate, the refractive index in these areas changes and the position measurements are affected.

In order to keep the measuring means operating to the high degree of accuracy that is required, any variation from the refractive index of said medium must be avoided.

SUMMARY OF THE INVENTION

One aspect of the present invention provides a lithographic projection apparatus in which escapage of the purge gas does not influence the interferometric displacement measuring means in part by use of an interferometer operating at a wavelength $\lambda_1$ to measure the position of said substrate table or the position of a table which is a part of said patterning structure, a purge gas source to supply purge gas to a space, to displace therefrom ambient air, said space accommodating at least one of at least a part of said substrate table and at least a part of said table which is a part of said patterning structure, wherein said purge gas is substantially non-absorbent of said projection beam of radiation and has a refractive index at a wavelength $\lambda_1$ which is substantially the same as that of air when measured at the same wavelength, temperature and pressure.

The inventors have found that by flushing, for example, the mask and substrate stages, which typically comprise movable mask and substrate tables respectively, with a specific gaseous composition having a refractive index identical to that of air under the same measuring conditions, the interferometric displacement measuring means are able to operate to the required degree of accuracy, while permitting the use of radiation having a wavelength of 180 nm or less.

According to a further embodiment of the invention, there is provided an apparatus as specified above, which further comprises a second harmonic interferometric measuring means operating at wavelengths $\lambda_2$ and $\lambda_3$ for adjusting the measurements of said interferometric displacement measuring means to substantially eliminate the effects of variation in pressure and temperature, and wherein said purge gas comprises three or more different components, each component having refractivities at the wavelengths $\lambda_2$ and $\lambda_3$ such that the following equations are substantially fulfilled:

$$\sum_j^k F_j \alpha_{j1} = \alpha_{a1} \tag{1}$$

$$\sum_j^k F_j (\alpha_{j3} - \alpha_{j2}) = \alpha_{a3} - \alpha_{a2} \tag{2}$$

wherein $F_j$ is the fraction by volume of component j in the purge gas, which purge gas contains a total of k components, $\alpha_{j1}$ is the refractivity of component j at a wavelength $\lambda_1$, $\alpha_{j2}$ is the refractivity of component j at a wavelength $\lambda_2$, $\alpha_{j3}$ is the refractivity of component j at a wavelength $\lambda_3$, $\alpha_{a1}$ is the refractivity of air at a wavelength $\lambda_1$, $\alpha_{a2}$ is the refractivity of air at a wavelength $\lambda_2$ and $\alpha_{a3}$ is the refractivity of air at a wavelength $\lambda_3$; and wherein:

$$\sum_j^k F_j = 1. \tag{3}$$

Where a second harmonic interferometer is present in the apparatus, the simple adjustment of the refractive index of the purge gas to that of air at the wavelength of operation of the displacement measuring interferometer, is not sufficient to overcome the errors in the displacement measurement caused by purge gas leakage. The present inventors have therefore devised a purge gas composition which comprises at least three different components, each component typically having significantly differing refractivities (wherein the refractivity is defined as the refractive index-1). With proper choice of gases, such that the gases fulfil, or substantially fulfil the equations given above, the compositional variation of the purge gas will have no, or substantially no effect on the measurements of either interferometer. Thus accurate positional measurements, which take into account variations in temperature, pressure and leakage of purge gas, may be obtained.

According to a further aspect of the invention there is provided a lithographic apparatus as specified in the opening paragraph which is characterized by:

an interferometric displacement measuring means operating at a wavelength $\lambda_1$ for measuring the position of said substrate table or the position of a table which is a part of said patterning structure;

a second harmonic interferometric measuring means operating at wavelengths $\lambda_2$ and $\lambda_3$ for adjusting the measurements of the said interferometric displacement measuring means to substantially eliminate the effects of variation in pressure and temperature;

flushing gas means for supplying purge gas to a space, to displace therefrom ambient air, said space accommodating at least a part of said substrate table and/or at least a part of said table which is a part of said patterning structure, wherein said purge gas is substantially non-absorbent of said projection beam of radiation and comprises two or more components, each component having refractivities at the wavelengths $\lambda_1$, $\lambda_2$ and $\lambda_3$ such that the following equation is substantially fulfilled:

$$\frac{\alpha_{m1}}{(\alpha_{m3} - \alpha_{m2})} = K_a \quad (4)$$

wherein $\alpha_{m1}$ is the refractivity of the purge gas at a wavelength $\lambda_1$, $\alpha_{m2}$ is the refractivity of the purge gas at a wavelength $\lambda_2$, $\alpha_{m3}$ is the refractivity of the purge gas at a wavelength $\lambda_3$ and $$K_a = \frac{\alpha_{a1}}{(\alpha_{a3} - \alpha_{a2})} \quad (5)$$

wherein $\alpha_{a1}$ is the refractivity of air at a wavelength $\lambda_1$, $\alpha_{a2}$ is the refractivity of air at a wavelength $\lambda_2$ and $\alpha_{a3}$ is the refractivity of air at a wavelength $\lambda_3$.

In this aspect, neither the displacement measuring interferometer nor the second harmonic interferometer is required to provide an accurate measurement which takes into account purge gas contamination. Rather, this aspect ensures that the overall interferometric system is adjusted to account for the effect of purge gas contamination. This is achieved by off-setting the errors in the displacement measuring interferometer with those of the second harmonic interferometer. This aspect of the invention provides an alternative manner in which the effects of temperature, pressure and leakage of purge gas may be accurately accounted for in the measurements of the interferometers and allows a simpler mixture of gases, for example only two different gases, to be used.

According to a further aspect of the invention there is provided a lithographic apparatus as specified in the opening paragraph which is characterized by
  flushing gas means for supplying purge gas to a space, to displace therefrom ambient air, said space accommodating at least a part of said substrate table and/or at least a part of a table which is a part of said patterning structure, wherein said purge gas is substantially non-absorbent of said projection beam of radiation;
  an interferometric displacement measuring means operating at a wavelength $\lambda_1$ for measuring the position of said substrate table or the position of said table which is a part of said patterning structure; and
  a second harmonic interferometric measuring means operating at wavelengths $\lambda_2$ and $\lambda_3$ for adjusting the measurements of the said interferometric displacement measuring means (DI) according to the following equation:

$$L = (DI) - K(SHI) \quad (9)$$

wherein L is the adjusted interferometric displacement measuring means measurement, SHI is the measurement of the second harmonic interferometric measuring means and K is a coefficient, the value of which is optimized such that the effects of variation in pressure, temperature and purge gas composition are partially eliminated from the adjusted measurement L.

In this aspect of the invention, the coefficient K is optimized in order to give the least possible error in the length measurement L. This embodiment is less demanding than the first three embodiments of the invention in terms of the specific combinations of gases which may be used and therefore provides a more cost effective manner in which the errors introduced by the purge gas compositional variation can be reduced.

According to a further aspect of the invention there is provided a device manufacturing method comprising the steps of:
  providing a substrate that is at least partially covered by a layer of radiation-sensitive material;
  providing a projection beam of radiation using a radiation system;
  using patterning structure to endow the projection beam with a pattern in its cross-section;
  projecting the patterned beam of radiation onto a target area of the layer of radiation-sensitive material,
characterized by the steps of
  determining the position of a table using interferometric displacement measuring means operating at a wavelength $\lambda_1$, said table either being suitable for holding said substrate or forming a part of said patterning structure;
  providing purge gas to a space accommodating at least a part of said table to displace therefrom ambient air, wherein said purge gas is substantially non-absorbent of said projection beam of radiation and has a refractive index at a wavelength $\lambda_1$ which is substantially the same as that of air when measured at the same wavelength, temperature and pressure.

In a preferred embodiment, the method further comprises the step of adjusting the measurement of said interferometric displacement measuring means to substantially eliminate the effects of variation in pressure and temperature using a second harmonic interferometric measuring means operating at wavelengths $\lambda_2$ and $\lambda_3$. In this embodiment the purge gas comprises three or more different components, each component having refractivities at the wavelengths $\lambda_2$ and $\lambda_3$ such that the following equations are substantially fulfilled:

$$\sum_j^k F_j \alpha_{j1} = \alpha_{a1} \quad (1)$$

$$\sum_j^k F_j (\alpha_{j3} - \alpha_{j2}) = \alpha_{a3} - \alpha_{a2} \quad (2)$$

wherein $F_j$ is the fraction by volume of component j in the purge gas, which purge gas contains a total of k components, $\alpha_{j1}$ is the refractivity of component j at a wavelength $\lambda_1$, $\alpha_{j2}$ is the refractivity of component j at a wavelength $\lambda_2$, $\alpha_{j3}$ is the refractivity of component j at a wavelength $\lambda_3$, $\alpha_{a1}$ is the refractivity of air at a wavelength $\lambda_1$, $\alpha_{a2}$ is the refractivity of air at a wavelength $\lambda_2$ and $\alpha_{a3}$ is the refractivity of air at a wavelength $\lambda_3$, and wherein:

$$\sum_j^k F_j = 1. \quad (3)$$

A further aspect of the invention provides a device manufacturing method comprising the steps of:
  providing a substrate that is at least partially covered by a layer of radiation-sensitive material;

providing a projection beam of radiation using a radiation system;

using patterning structure to endow the projection beam with a pattern in its cross-section;

projecting the patterned beam of radiation onto a target area of the layer of radiation-sensitive material, characterized by the steps of:

determining the position of a table using interferometric displacement measuring means operating at a wavelength $\lambda_1$, said table either being suitable for holding said substrate or forming a part of said patterning structure;

adjusting the measurement of said interferometric displacement measuring means to substantially eliminate the effects of variation in pressure and temperature using a second harmonic interferometric measuring means operating at wavelengths $\lambda_2$ and $\lambda_3$;

providing purge gas to a space accommodating at least a part of said table to displace therefrom ambient air, wherein said purge gas is substantially non-absorbent of said projection beam of radiation and comprises two or more components, each component having refractivities at the wavelengths $\lambda_1$, $\lambda_2$ and $\lambda_3$ such that the following equation is substantially fulfilled:

$$\sum_{j}^{k} F_j = 1. \quad (3)$$

wherein $\alpha_{m1}$ is the refractivity of the purge gas at a wavelength $\lambda_1$, $\alpha_{m2}$ is the refractivity of the purge gas at a wavelength $\lambda_2$, $\alpha_{m3}$ is the refractivity of the purge gas at a wavelength $\lambda_3$ and $$K_a = \frac{\alpha_{a1}}{(\alpha_{a3} - \alpha_{a2})} \quad (5)$$

wherein $\alpha_{a1}$ is the refractivity of air at a wavelength $\lambda_1$, $\alpha_{a2}$ is the refractivity of air at a wavelength $\lambda_2$ and $\alpha_{a3}$ is the refractivity of air at a wavelength $\lambda_3$.

A further aspect of the invention provides a device manufacturing method comprising the steps of:

providing a substrate that is at least partially covered by a layer of radiation-sensitive material;

providing a projection beam of radiation using a radiation system;

using patterning structure to endow the projection beam with a pattern in its cross-section;

projecting the patterned beam of radiation onto a target area of the layer of radiation-sensitive material, characterized by the steps of:

providing purge gas to a space accommodating at least a part of a table to displace therefrom ambient air, said table either being suitable for holding said substrate or forming a part of said patterning structure, wherein said purge gas is substantially non-absorbent of said projection beam of radiation;

determining the position of said table using interferometric displacement measuring means operating at a wavelength $\lambda_1$; and adjusting the measurement of said interferometric displacement measuring means (DI) using a second harmonic interferometric measuring means operating at wavelengths $\lambda_2$ and $\lambda_3$ according to the following equation:

$$L=(DI)-K(SHI) \quad (9)$$

wherein L is the adjusted interferometric displacement measuring means measurement, SHI is the measurement of the second harmonic interferometric measuring means and K is a coefficient, the value of which is optimized such that the effects of variation in pressure, temperature and purge gas composition are partially eliminated from the adjusted value L.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

In the present document, the terms illumination radiation and illumination beam are used to encompass all types of electromagnetic radiation, including ultraviolet radiation (e.g. with a wavelength of 365, 248, 193, 157 or 126 nm) and EUV, as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiment 1

Figure 1:
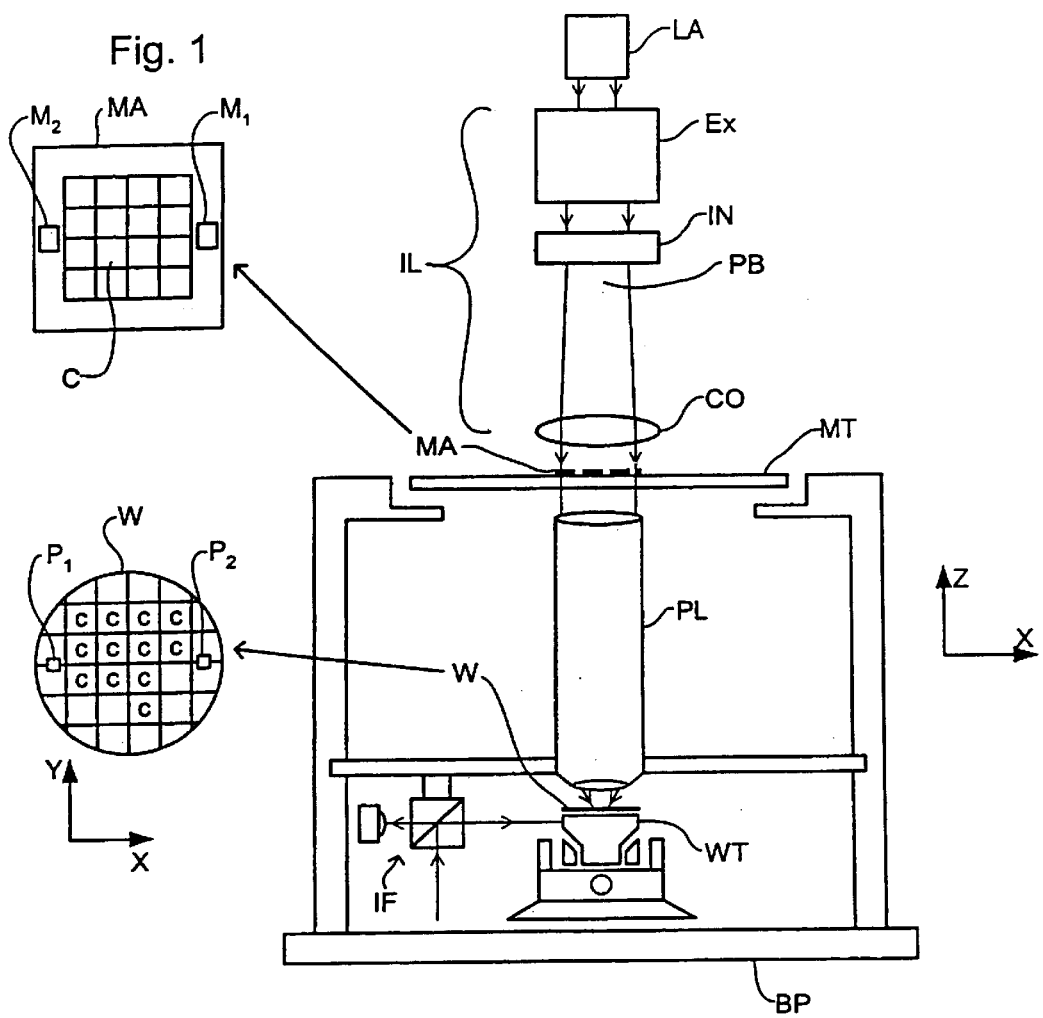
FIG. 1 depicts a lithographic projection apparatus according to an embodiment of the invention.

FIG. 1 schematically depicts a lithographic projection apparatus according to a particular embodiment of the invention. The apparatus comprises:

a radiation system LA, Ex, IL, for supplying a projection beam PB of radiation (e.g. U.V. or E.U.V. radiation, for example radiation having a wavelength of less than 180 nm, for example about 157 nm or 126 nm);

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive or catadioptric system of a mirror group) for imaging an irradiated portion of the mask MA onto a target portion C (comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The radiation system comprises a source LA (e.g. an Hg lamp or an excimer laser) that produces a beam of radiation. This beam is fed into an illumination system (illuminator) IL, either directly or after being passed through conditioning means, such as a beam expander Ex, for example. The illuminator IL comprises adjusting means for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA which is held in a mask holder on a mask table MT. Having traversed the mask MA, the beam PB passes through the lens PL, which focuses the beam PB onto a target portion C of the substrate W. With the aid of the second positioning means (and interferometric measuring means IF comprising an interferometric displacement measuring device operating at a wavelength $\lambda_1$, for example at about 633 nm), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long stroke module (coarse positioning) and a short stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:
1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
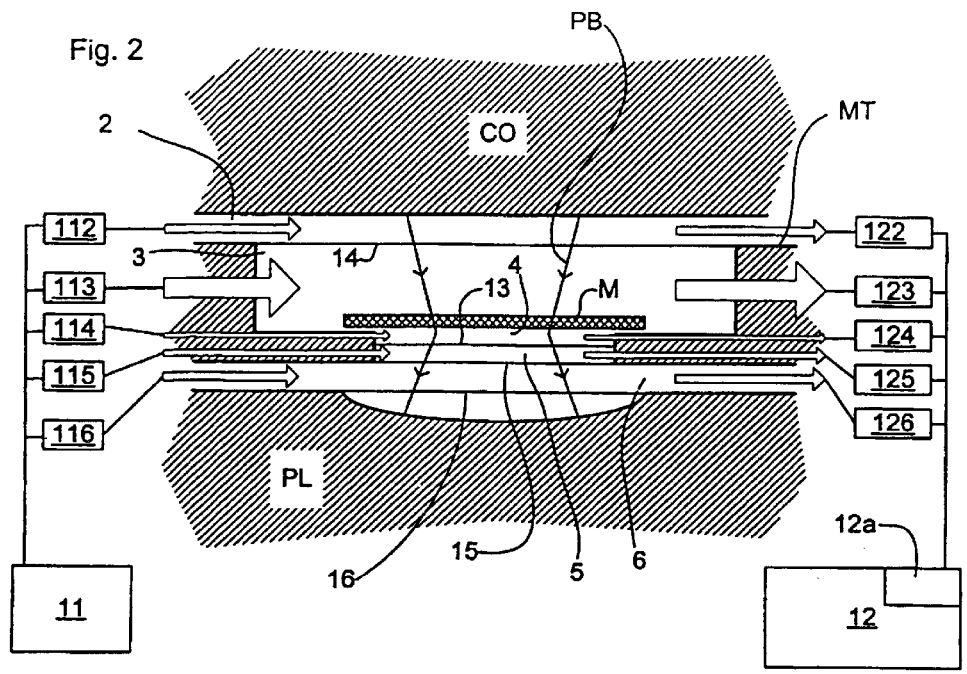
FIG. 2 shows the mask stage of the lithographic projection apparatus of FIG. 1 in more detail.

FIG. 2 shows the mask stage, comprising mask table MT, of the lithographic apparatus according to the invention in more detail.

It will be seen that the mask M is held in a recess in mask table MT, which can be manufactured from a ceramic material such as Zerodur (RTM) and is positioned by a drive system (not shown) during operation of the lithographic apparatus. The mask table MT is closely sandwiched between the last element of the collimating optics CO, which generate the projection beam PB, and the first element of the projection lens system PL, which projects the projection beam PB, having passed through the mask M, onto the wafer W (shown in FIGS. 1 and 3).

The mask stage may be divided into zones or spaces 2 to 6 as follows: space 2 is between the final illuminator optics CO and mask table MT; space 3 is within the mask table MT above the mask M; space 4 is within the mask table MT, between the mask M and pellicle 13; space 5 is within the mask table MT below the pellicle 13; and space 6 is between the mask table MT and projection lens system PL. Each of the spaces is flushed with a purge gas provided from gas supply 11 via respective flow regulators 112 to 116. At the other side of each space the purge gas is removed to reservoir 12 via respective vacuum pumps 122 to 126. Reservoir 12 may be partitioned to allow controlled re-use of the gas in selected spaces and may included devices 12a to clean or scrub the recovered gas.

If desired, the various spaces in the mask stage can be separated from one another to ensure laminar flow. For example, a thin sheet 14, e.g. of CaF or fused $SiO_2$, may be provided to cover the recess in the mask table MT and separate space 2 from space 3. Similarly, sheets 15 and 16 may be used to separate spaces 5 and 6, and to cover the non-flat surface of the first element of the projection lens system PL, respectively.

To supply and remove the gas flow to spaces 3, 4 and 5, within the mask table MT, appropriate conduits are provided in the body of the mask table. When the mask table has been exposed to air, e.g. after a period of non-operation of the apparatus or after mask exchange, purge gas is supplied for a short period before an exposure is taken to flush out any air that may have accumulated, e.g. in non-flat parts of the mask table.

Figure 3:
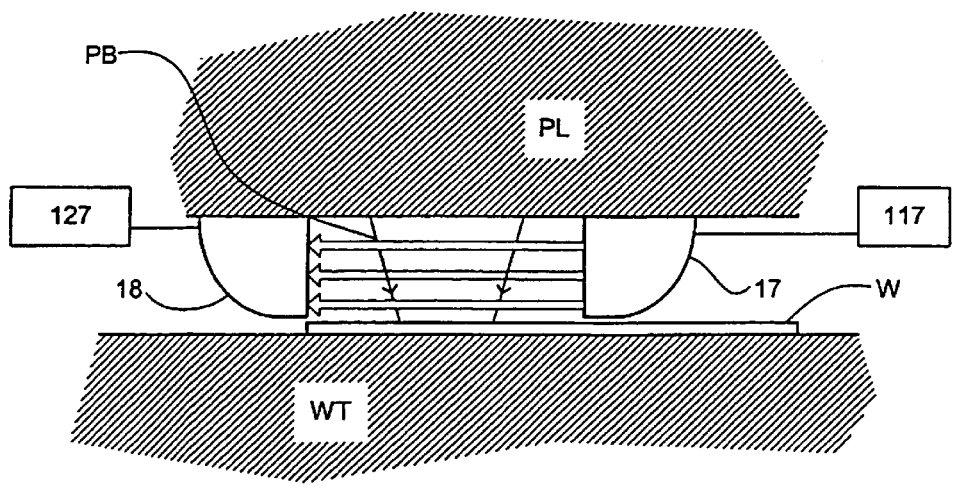
FIG. 3 depicts the substrate stage of the lithographic projection apparatus of FIG. 1 in more detail.

FIG. 3 shows the wafer stage of the lithographic apparatus of FIG. 1. To avoid having to provide a purge gas path covering the entire range of movement of the wafer stage, the flushing gas supply outlets 17 and evacuation inlets 18 are mounted on the lower end of the projection lens system PL, either side of the final element. Outlets 17 and inlets 18 are respectively connected to the gas supply 11 and reservoir 12 via flow regulator 117 and vacuum pump 127 respectively. The outlets 17 in particular, but also the inlets 18, may be provided with vanes to guide the flow of purge gas. If not already flat, the final element of the projection lens system PL may be covered with a thin sheet as discussed above.

The flow regulators 112 to 117 mentioned above may comprise static or controllable pressure or flow reducers and/or blowers as required to provide the necessary gas flow rates for the particular embodiment and the available gas supply.

According to the invention, the mask stage and/or the substrate stage of the apparatus may be flushed with a purge gas. The purge gas typically comprises a mixture of two or more gases selected from $N_2$, He, Ne, Ar, Kr and Xe. The gas composition used is one which is substantially transparent to UV radiation of the wavelength of the projection beam and has a refractive index which is substantially the same as that of air, when measured under the same conditions of temperature and pressure (e.g. standard clean room conditions) and using radiation of the same wavelength. The refractive index should be the same as that of air at the wavelength of a radiation beam used in the interferometric displacement measuring means IF. The pressure of the purge gas in the mask and/or substrate stages may be atmospheric pressure, or it may be above atmospheric pressure so that any leak results in an outflow of gas rather than contaminating the system with incoming air.

To determine which mixtures of gases are suitable for use in the present invention, the refractive index of the mixture must be known. The refractive index $n_1$ of a mixture of k gases at a specific partial pressure, temperature and at a wavelength $\lambda_1$ can be determined using the following equation:

$$n_1 - 1 = \sum_{j}^{k} F_j(n_{jl} - 1) \tag{6}$$

wherein $n_{j1}$ is the refractive index of the pure gas j at a wavelength $\lambda_1$.

The refractivity cc is related to the refractive index n, via the equation:

$$\alpha_i = n_i - 1 \tag{6a}$$

Thus, for the mixture of k gases $$\alpha_1 = \sum_{j}^{k} F_j \alpha_{jl} \tag{7}$$

where $F_j$ is the relative volume concentration of the gas j, and $\alpha_{j1}$ is the refractivity of the pure gas j at a wavelength $\lambda_1$. Thus, for the purposes of this embodiment of the present invention, if the purge gas consists of a mixture of gases x and y, the relative volume concentrations of the two gases must comply with the equation:

$$\alpha_{a1} = F_x \alpha_{x1} + F_y \alpha_{y1} \tag{8}$$

where $\alpha_{a1}$ is the refractivity of air at a wavelength $\lambda_1$. Or, more generally, $$\sum_{j}^{k} F_j \alpha_{jl} = \alpha_{al} \tag{1}$$

wherein $F_j$, $\alpha_{j1}$ and $\alpha_{a1}$ are as defined above and wherein $$\sum_{j}^{k} F_j = 1 \tag{3}$$

Refractivities and refractive indices are dependent on pressure, temperature and wavelength, thus all values of n and α in the above equations, and all other equations mentioned herein, must relate to the same temperature and pressure. Typically standard clean room conditions are used. The wavelength used for the calculations, $\lambda_1$, should be the same as that of at least one of the radiation beams of the interferometric displacement measuring means.

Suitable mixtures of gases which comply with this equation include mixtures comprising $N_2$ and either from 1 to 5 vol. % He, preferably from 2 to 3 vol. % He; from 1 to 5 vol. % Ne, preferably from 3.5 to 2.5 vol. % Ne; or from 35 to 50 vol. % Ar, preferably from 40 to 45 vol. % Ar; mixtures comprising Ar and from 1 to 5 vol. % Xe, preferably from 2 to 3 vol. % Xe; mixtures comprising Ar and from 5 to 10 vol. % Kr, preferably from 6 to 8 vol. % Kr; and mixtures comprising $N_2$, from 0.5 to 3 vol. % He and from 0.5 to 3 vol. % Xe. Preferred mixtures of gases, for use with a wavelength $\lambda_1$ of 633 nm, include those set out in Table 1 below. All figures are in % by volume.

TABLE 1

| Example | $N_2$ | He | Ne | Ar | Kr | Xe |
|---------|------|-----|-----|------|-----|-----|
| 1 | 97.3 | 2.7 | | | | |
| 2 | 97.0 | | 3.0 | | | |
| 3 | 59.0 | | | 41.0 | | |
| 4 | | | | 97.5 | | 2.5 |
| 5 | | | | 92.9 | 7.1 | |

Embodiment 2

In this embodiment of the invention, which is the same as the first embodiment except as described below, the interferometric measuring means IF comprises an interferometric displacement measuring device and a second harmonic interferometric device. The second harmonic interferometric device measures the refractivity of the atmosphere in the apparatus at two different wavelengths. In this manner it is possible to determine the effects of pressure and temperature on the refractivity and therefore to adjust accordingly the measurement of the displacement interferometer to account for such variations.

This is achieved by multiplying the measurement of the second harmonic interferometer by a coefficient $K_a$ and subsequently subtracting this value from the displacement interferometer measurement. Thus, the corrected length, L is given by $$L = (DI) - K_a(SHI) \tag{9}$$

wherein DI is the displacement interferometer measurement and SHI is the second harmonic interferometer measurement, wherein DI and SHI are corrected for operation in average air.

The coefficient $K_a$ is determined as follows:

$$K_a = \frac{\alpha_{al}}{(\alpha_{a3} - \alpha_{a2})} \tag{5}$$

wherein $\alpha_{ay}$ is the refractivity of air at a wavelength By and wherein the interferometric displacement measuring means is operated at a wavelength $\lambda_1$ and the second harmonic interferometric measuring means is operated at wavelengths $\lambda_2$ and $\lambda_3$, with the wavelength $\lambda_2$ typically being greater than the wavelength $\lambda_3$. For example $\lambda_2$ may be about 532 nm and $\lambda_3$ about 266 nm. Typically, $\lambda_1$ is different from $\lambda_2$ and $\lambda_3$. However, it is possible for $\lambda_1$ to be equal either to $\lambda_2$ or to $\lambda_3$.

The adjustment of the displacement interferometer measurement in this manner ensures that the positional measurement is not affected by variations in temperature and pressure inside the lithographic apparatus.

The selection of a purge gas having a refractive index (or refractivity) the same as air at a wavelength $\lambda_1$ ensures that the displacement interferometric device is accurate even when purge gas leaks into the measurement area. However, leakage of the purge gas may still cause significant inaccuracies in the refractivity measurements at the wavelengths $\lambda_2$ and $\lambda_3$ at which the second harmonic interferometer operates. This, in turn, can cause errors in the final positional measurement. The present embodiment of the invention accounts for this problem by ensuring that leakage of the purge gas has no effect on either interferometric device. This can be achieved using a purge gas comprising k gases, k being three or more, and fulfilling, or substantially fulfilling, the following three equations:

$$\alpha_{a1} = \sum_{j}^{k} F_j \alpha_{j1} \quad (1)$$

$$\sum_{j}^{k} F_j(\alpha_{j3} - \alpha_{j2}) = \alpha_{a3} - \alpha_{a2} \quad (2)$$

$$\sum_{j}^{k} F_j = 1. \quad (3)$$

wherein F, $\alpha$, j and k are as defined above.

By solving the above three equations simultaneously, the required fraction of each of the gases j can be determined. The fulfillment of equation (1) ensures that the refractivity (or refractive index) of the mixture at a wavelength $\lambda_1$ is the same as that of air when measured at the same wavelength, temperature and pressure.

Suitable mixtures of gases for use in this embodiment include mixtures of three or more components having different refractivities. For example, the purge gas may comprise one or more components having a refractivity of less than $1 \times 10^{-4}$ at a wavelength of from 200 to 700 nm and two or more components having refractivites of greater than $1 \times 10^{-4}$ at a wavelength of from 200 to 700 nm. Typically, the component having a refractivity of less than $1 \times 10^{-4}$ at a wavelength of from 200 to 700 nm will be present in an amount of from 1 to 40%, preferably 2 to 20% by volume and the two or more components having refractivites of greater than $1 \times 10^{-4}$ at a wavelength of from 200 to 700 nm will be present in an amount of from 60 to 99%, preferably 80 to 98% by volume.

For example, the purge gas may comprise three of more gases selected from $N_2$, He, Ne, Ar, Kr and Xe. Typically, the purge gas comprises He and/or Ne together with two or more gases selected from $N_2$, Ar, Kr and Xe. More preferably, the purge gas comprises He and/or Ne; Ar and/or $N_2$; and Kr and/or Xe.

Typically, the purge gas comprises He and/or Ne in an amount of from 1 to 40%, preferably 2 to 20%, more preferably from 4 to 16% by volume and two or more gases selected from $N_2$, Ar, Kr and Xe in an amount of from 60 to 99%, preferably 80 to 98%, more preferably 84 to 96% by volume. For example, the purge gas may comprise He and/or Ne in an amount of from 2 to 20%, preferably from 4 to 16% by volume; Ar and/or $N_2$ in an amount of from 50 to 96%, preferably from 60 to 92% by volume; and Kr or Xe in an amount of from 2 to 40%, preferably from 3 to 30% by volume. Most preferably, the purge gas comprises He and/or Ne in an amount of from 2 to 20%, preferably from 4 to 16% by volume; together with (i) Ar and/or $N_2$ in an amount of from 50 to 70% by volume and Kr in an amount of from 10 to 40% by volume; or (ii) Ar and/or $N_2$ in an amount of from 70 to 90% by volume and Xe in an amount of from 0.5 to 20% by volume.

Preferred purge gases according to this embodiment include those set out in Table 2 below. All figures are given in % by volume.

TABLE 2

| Example | $N_2$ | He | Ne | Ar | Kr | Xe |
|---|---|---|---|---|---|---|
| 6 | 66.4 | 12.7 | | | 20.9 | |
| 7 | 60.7 | | 15.9 | | 23.4 | |
| 8 | | 9.5 | | 67.6 | 23.0 | |
| 9 | | | 12.1 | 63.1 | 24.8 | |
| 10 | 87.1 | 8.8 | | | | 4.2 |
| 11 | 84.9 | | 10.6 | | | 4.5 |
| 12 | | 3.9 | | 91.4 | | 4.8 |
| 13 | | | 4.7 | 90.4 | | 4.9 |

Embodiment 3

In the third embodiment of the invention, which is the same as the first embodiment except as described below, a second harmonic interferometric device is used to adjust the measurements of the displacement interferometer to account for variations in temperature and pressure. The second harmonic interferometric device is described in Embodiment 2 above. In this third embodiment, the response of the overall interferometric system is adjusted to account for purge gas contamination. This is achieved by off-setting the errors caused by purge gas contamination in each of the two interferometric devices.

In this embodiment, at least two components make up the purge gas, and the following equation must be substantially fulfilled:

$$\frac{\alpha_{m1}}{(\alpha_{m3} - \alpha_{m2})} = K_a \quad (4)$$

wherein $\alpha_{m1}$, $\alpha_{m2}$ and $\alpha_{m3}$ are as defined above; and $$K_a = \frac{\alpha_{a1}}{(\alpha_{a3} - \alpha_{a2})} \quad (5)$$

wherein $\alpha_{a1}$, $\alpha_{a2}$ and $\alpha_{a3}$ are as defined above. As for embodiments 1 and 2, the sum of the gaseous fractions must equal 1, thus $$\sum_{j}^{k} F_j = 1 \quad (3)$$

wherein F, j and k are as defined above.

The refractivity of the purge gas for wavelength $\lambda_1$ is given by:

$$\sum_{j}^{k} F_j \alpha_{j1} = \alpha_{m1} \quad (10)$$

For wavelength $\lambda_2$ said refractivity is given by:

$$\sum_{j}^{k} F_j \alpha_{j2} = \alpha_{m2} \quad (11)$$

and for $\lambda_3$ $$\sum_{j}^{k} F_j \alpha_{j3} = \alpha_{m3} \quad (12)$$

with the condition that $$\sum_{j}^{k} F_j = 1 \quad (3)$$

Different purge gas compositions can be calculated by combining equations (10), (11) and (12) with the condition that equations (3), (4) and (5) must be fulfilled. For more information with regard to refractivity see, for example, Max Born & Emil Wolf, Principles of optics, electric theory of propagation interference and diffraction of light, sixth edition, Pergamon Press Oxford, incorporated herein by reference.

Suitable mixtures of gases include mixtures of two or more components having different refractivities. For example, the purge gas may comprise one or more components having a refractivity of less than $3\times10^{-4}$ at a wavelength of from 200 to 700 nm and one or more components having a refractivity of greater than $3\times10^{-4}$ at a wavelength of from 200 to 700 nm. Typically, the one or more components having a refractivity of less than $3\times10^{-4}$ at a wavelength of from 200 to 700 $\mu$m will be present in an amount of from 50 to 99% by volume and the one or more components having a refractivity of greater than $3\times10^{-4}$ at a wavelength of from 200 to 700 $\mu$m will be present in an amount of from 1 to 50% by volume. The refractive index (or refractivity) of the purge gas mixture at a wavelength $\lambda_1$ differs from that of air when measured at the same wavelength, temperature and pressure.

For example, the purge gas may comprise two of more gases selected from $N_2$, He, Ne, Ar, Kr and Xe. Typically, the purge gas comprises one or more gases selected from $N_2$, He, Ne and Ar together with Kr and/or Xe.

Typically, the purge gas comprises $N_2$, He, Ne and/or Ar in an amount of from 50% to 99%, preferably from 65 to 98% by volume and Kr and/or Xe in an amount of from 1 to 50%, preferably 2 to 35% by volume. For example, the purge gas may comprise $N_2$, He, Ne and/or Ar in an amount of from 65 to 90% by volume and Kr in an amount of from 10 to 35% by volume. Alternatively, the purge gas may comprise $N_2$, He, Ne and/or Ar in an amount of from 90 to 98% by volume and Xe in an amount of from 2 to 10% by volume.

Preferred purge gases according to this embodiment include those set out in Table 3 below. All figures are given in % by volume.

TABLE 3

| Example | $N_2$ | He | Ne | Ar | Kr | Xe |
|---|---|---|---|---|---|---|
| 14 | 78.6 | | | | 21.4 | |
| 15 | 95.7 | | | | | 4.3 |
| 16 | | 82.1 | | | 17.9 | |
| 17 | | 96.6 | | | | 3.4 |
| 18 | | | 69.8 | | 30.2 | |
| 19 | | | 93.4 | | | 6.6 |
| 20 | | | | 76.4 | 23.6 | |
| 21 | | | | 95.2 | | 4.8 |

Embodiment 4

According to a further embodiment of the invention, which is the same as the first embodiment except as described below, an apparatus may be used that typically only partially compensates for the effects of temperature, pressure and purge gas contamination. This embodiment may be particularly relevant where the expense or availability of certain components of the preferred purge gas, for example Kr or Xe are prohibitive.

In this embodiment, the correction coefficient, K, determined by the second harmonic interferometric device may be optimized such that the correction to account for pressure and temperature variation is not quite accurate, but that the errors introduced by the contamination with purge gas are corrected to some extent. Thus, simultaneous correction of pressure, temperature and purge gas errors using an approximate value of the second harmonic interferometer coefficient is used.

The approximate coefficient may be calculated as described below. In this calculation scheme $\alpha_{jx}$, $\alpha_{mx}$ and $\alpha_{ax}$ represent the refractivity of a gas j, the purge gas or air respectively at a wavelength $\lambda_x$ and $\alpha_{cx}$ represents the refractivity of air contaminated by a relative amount c of the purge gas:

$$\alpha_{cx}=(1-c)\alpha_{ax}+c\alpha_{mx} \quad (13)$$

Both turbulence and contamination of the air in the path of the displacement measuring interferometer cause changes in the observed index of refraction of the air in the measurement path. The error, E, in the measured distance is given by $$E=(\Delta\alpha_{c1}-K\Delta(\alpha_{c3}-\alpha_{c2}))L \quad (14)$$

Here L is the length of the measurement path of the displacement measuring interferometer, $\Delta\alpha_{c1}$ is the change in the refractivity at a wavelength $\lambda_1$ and $\Delta(\alpha_{c3}-\alpha_{c2})$ is the change in the difference in refractivity between the wavelengths $\lambda_2$ and $\lambda_3$ of the second harmonic interferometer system. The refractivities are proportional to the quotient pressure (p) over absolute temperature (T), so, accounting for pressure and temperature effects only, $\Delta\alpha_{c1}$ and $\Delta(\alpha_{c3}-\alpha_{c2})$ are given by:

$$\Delta\alpha_{c1} = \alpha_{c1}\frac{\Delta\rho}{\rho_0} \quad (15)$$

$$\Delta(\alpha_{c3} - \alpha_{c2}) = (\alpha_{c3} - \alpha_{c2})\frac{\Delta\rho}{\rho_0} \quad (16)$$

wherein $\rho=p/T$ and $\Delta\rho$ is the variation in $\rho$.

Accounting for the variation in the relative amount of contamination by the purge gas, $\Delta_c$, $\Delta\alpha_{c1}$ and $\Delta(\alpha_{c3}-\alpha_{c2})$ are given by $$\Delta\alpha_{c1}=\Delta c(\alpha_{m1}-\alpha_{a1}) \quad (17)$$

$$\Delta(\alpha_{c3}-\alpha_{c2})=\Delta c(\alpha_{m3}-\alpha_{a3}-\alpha_{m2}+\alpha_{a2}) \quad (18)$$

If $\sigma_\rho$ is the standard deviation of $\rho$, then the standard deviation of the error due to turbulence ($\sigma_{E,\rho}$) is given by:

$$\sigma_{E,\rho} = \frac{\sigma_\rho}{\rho}(\alpha_{c1} - K(\alpha_{c3} - \alpha_{c2}))L \quad (19)$$

If $\sigma_c$ is the standard deviation of c, then the standard deviation of the error due to purge gas contamination ($\sigma_{E,c}$) is given by:

$$\sigma_{E,c}=\sigma_c((\alpha_{m1}-\alpha_{a1})-K(\alpha_{m3}-\alpha_{m2}-\alpha_{a3}+\alpha_{a2}))L \quad (20)$$

The total variance of the length measurement is given by $$\sigma_T^2 = \sigma_{E,\rho}^2 + \sigma_{E,c}^2 \quad (21)$$

$$\sigma_T^2 = L^2[(\alpha_{c1})^2 - 2K(\alpha_{c3} - \alpha_{c2})(\alpha_{c1}) +$$
$$K^2(\alpha_{c3} - \alpha_{c2})^2]\left(\frac{\sigma_\rho}{\rho}\right)^2 + [(\alpha_{m1} - \alpha_{a1})^2 -$$
$$2K(\alpha_{m1} - \alpha_{a1})(\alpha_{m3} - \alpha_{a3} - \alpha_{m2} + \alpha_{a2}) +$$
$$K^2(\alpha_{m3} - \alpha_{a3} - \alpha_{m2} + \alpha_{a2})^2]\sigma_C^2$$

The optimum value of K can be found by setting $$\frac{\partial(\sigma_T^2)}{\partial K} = 0.$$

The resulting optimum value for K is given by $$K = \frac{(\alpha_{c3} - \alpha_{c2})(\alpha_{c1})\left(\frac{\sigma_\rho}{\rho_0}\right)^2 + (\alpha_{m1} - \alpha_{a1})(\alpha_{m3} - \alpha_{m2} - \alpha_{a3} + \alpha_{a2})\sigma_C^2}{(\alpha_{c3} - \alpha_{c2})^2\left(\frac{\sigma_\rho}{\rho_0}\right)^2 + (\alpha_{m3} - \alpha_{m2} - \alpha_{a3} + \alpha_{a2})^2\sigma_C^2} \quad (22)$$

The value of K given by this formula thus provides simultaneous, although not necessarily complete, correction of the pressure, temperature and purge gas errors. When the variance in contamination is zero, the above formula reduces to formula (5), i.e. that usually used to correct for pressure and temperature alone.

The purge gas used in this embodiment may have a refractive index which differs from that of air at a wavelength $\lambda_1$. In another aspect of the embodiment the purge gas has a refractive index at a wavelength $\lambda_1$, which is similar to, or substantially the same as, that of air at the same wavelength, temperature and pressure.

It should be noted that the use of helium or neon alone, or predominantly alone, may be used in this embodiment of the present invention. Thus, the purge gas may comprise at least 90%, preferably at least 95% or 98% of either helium or neon alone or of a mixture of these gases. Both gases have very low refractivities and the variation in their refractivites between the wavelengths commonly employed in the interferometric devices in lithographic equipment is small. Contamination of the interferometric measurement area with one of these two gases acts effectively as if the pressure in the chamber has been reduced, and this can be compensated for in the usual manner by the second harmonic interferometric device. The advantage of this aspect of the embodiment is that helium and neon, in particular helium, are relatively inexpensive gases. Further, when an approximate coefficient K is calculated, the use of such coefficient results in very little total error.

The combination of helium or neon, however, with nitrogen provides an improved system which retains the low overall error, but the extent to which the errors produced by the two different interferometers are off-set against one another is much lower. This has the additional advantage that small fractional errors in either of the two interferometers will cause a smaller overall error in the result produced by the interferometric system. Therefore, an alternative purge gas for use in this embodiment of the invention comprises a mixture of helium and/or neon with nitrogen. For example a mixture of from 90 to 99% by volume nitrogen and from 1 to 10% by volume helium and/or neon, or more preferably from 94 to 96% by volume nitrogen and from 4 to 6% by volume helium and/or neon.

While specific embodiments of the invention have been described above, it will be appreciated that the invention may be practiced otherwise than as described. The description is not intended to limit the invention.

What is claimed is:

1. A lithographic projection apparatus comprising:
   a radiation system to provide a projection beam of radiation;
   patterning structure to pattern the projection beam according to a desired pattern;
   a substrate table to hold a substrate;
   a projection system to image the patterned beam onto a target portion of the substrate,
   a displacement measuring interferometer having an operating wavelength $\lambda_1$ for measuring at least one of the position of said substrate table and the position of a table which is a part of said patterning structure;
   a purge gas source to supply purge gas to a space, to displace therefrom ambient air, said space accommodating at least one of at least a part of said substrate table and at least a part of said table which is a part of said patterning structure, wherein said purge gas is substantially non-absorbent of said projection beam of radiation and has a refractive index at a wavelength $\lambda_1$ which is substantially the same as that of air when measured at equal wavelength, temperature and pressure.

2. An apparatus according to claim 1 wherein the purge gas comprises two or more components selected from $N_2$, He, Ar, Kr, Ne and Xe.

3. An apparatus according to claim 2 wherein said purge gas comprises at least 95% by volume $N_2$ and at least 1% by volume He.

4. An apparatus according to claim 2 wherein said purge gas comprises at least 95% by volume Ar and at least 1% by volume Xe.

5. An apparatus according to claim 2 wherein said purge gas comprises at least 90% by volume Ar and at least 5% by volume Kr.

6. An apparatus according to claim 2, wherein said purge gas comprises at least 95% by volume $N_2$ and at least 1% by volume Ne.

7. An apparatus according to claim 2, wherein said purge gas comprises at least 50% by volume $N_2$ and at least 35% by volume Ar.

8. An apparatus according to claim 2 wherein said purge gas comprises at least 94% by volume $N_2$, at least 0.5% by volume He and at least 0.5% by volume Xe.

9. An apparatus according to claim 1, which further comprises a second harmonic interferometer having operating wavelengths $\lambda_2$ and $\lambda_3$ to adjust measurements of said displacement measuring interferometer to substantially eliminate effects of variation in pressure and temperature, and wherein said purge gas comprises at least three different components, each component having refractivities at the wavelengths $\lambda_2$ and $\lambda_3$ such that the following equations are substantially fulfilled:

$$\sum_j^k F_j \alpha_{j1} = \alpha_{a1} \quad (1)$$

$$\sum_j^k F_j (\alpha_{j3} - \alpha_{j2}) = \alpha_{a3} - \alpha_{a2} \quad (2)$$

wherein $F_j$ is the fraction by volume of component j in the purge gas, which purge gas contains a total of k components, $\alpha_{j1}$ is the refractivity of component j at a wavelength $\lambda_1$, $\alpha_{j2}$ is the refractivity of component j at a wavelength $\lambda_2$, $\alpha_{j3}$ is the refractivity of component j at a wavelength $\lambda_3$, $\alpha_{a1}$ is the refractivity of air at a wavelength $\lambda_1$, $\alpha_{a2}$ is the refractivity of air at a wave length $\lambda_2$ and $\alpha_{a3}$ is the refractivity of air at a wavelength $\lambda_3$; and wherein:

$$\sum_{j}^{k} F_j = 1. \tag{3}$$

10. An apparatus according to claim 9, wherein said purge gas comprises at least three different components selected from $N_2$, He, Ar, Kr, Ne and Xe.

11. An apparatus according to claim 10, wherein said purge gas comprises (i) $N_2$ and/or Ar in an amount of from 50–90% by volume, (ii) Xe and/or Kr in an amount of from 0.5 to 40% by volume and (iii) He and/or Ne in an amount of from 2 to 20% by volume.

12. A lithographic projection apparatus comprising:
   a radiation system to provide a projection beam of radiation;
   patterning structure to pattern the projection beam according to a desired pattern;
   a substrate table to hold a substrate;
   a projection system to image the patterned beam onto a target portion of the substrate;
   a displacement measuring interferometer having an operating wavelength $\lambda_1$ to measure at least one of a position of said substrate table and a position of a table which is a part of said patterning structure;
   a second harmonic interferometer having operating wavelengths $\lambda_2$ and $\lambda_3$ to adjust measurements of the displacement measuring interferometer to substantially eliminate the effects of variation in pressure and temperature;
   a purge gas source to supply purge gas to a space, to displace therefrom ambient air, said space accommodating at least one of at least a part of said substrate table and at least a part of said table which is a part of said patterning structure, wherein said purge gas is substantially non-absorbent of said projection beam of radiation and comprises at least two components, each component having refractivities at the wavelengths $\lambda_1$, $\lambda_2$ and $\lambda_3$ such that the following equation is substantially fulfilled:

$$\frac{\alpha_{m1}}{(\alpha_{m3} - \alpha_{m2})} = K_a \tag{4}$$

wherein $\alpha_{m1}$ is the refractivity of the purge gas at a wavelength $\lambda_1$, $\alpha_{m2}$ is the refractivity of the purge gas at a wavelength $\lambda_2$, $\alpha_{m3}$ is the refractivity of the purge gas at a wavelength $\lambda_3$ and $$K_a = \frac{\alpha_{a1}}{(\alpha_{a3} - \alpha_{a2})} \tag{5}$$

wherein $\alpha_{a1}$ is the refractivity of air at a wavelength $\lambda_1$, $\alpha_{a2}$ is the refractivity of air at a wavelength $\lambda_2$ and $\alpha_{a3}$ is the refractivity of air at a wavelength $\lambda_3$.

13. An apparatus according to claim 12, wherein said purge gas comprises at least two gases selected from $N_2$, He, Ar, Kr, Ne and Xe.

14. An apparatus according to claim 13, wherein said purge gas comprises (i) $N_2$, He, Ar and/or Ne in an amount of from 65 to 99.5% by volume and (ii) Kr and/or Xe in an amount of from 0.5 to 35% by volume.

15. A lithographic projection apparatus comprising:
   a radiation system to provide a projection beam of radiation;
   patterning structure to pattern the projection beam according to a desired pattern;
   a substrate table to hold a substrate;
   a projection system to image the patterned beam onto a target portion of the substrate;
   a purge gas source to supply purge gas to a space, to displace therefrom ambient air, said space accommodating at least one of at least a part of said substrate table and at least a part of said table which is a part of said patterning structure, wherein said purge gas is substantially non-absorbent of said projection beam of radiation;
   an displacement measuring interferometer having an operating wavelength $\lambda_1$ for measuring at least one of the position of said substrate table and the position of said table which is a part of said patterning structure; and
   a second harmonic interferometer having operating wavelengths $\lambda_2$ and $\lambda_3$ to adjust measurements of the displacement measuring interferometer (DI) according to the following equation:

$$L = (DI) - K(SHI) \tag{9}$$

wherein L is the adjusted displacement measuring interferometer measurement, SHI is the measurement of the second harmonic interferometer and K is a coefficient, the value of which is optimized such that effects of variation in pressure, temperature and purge gas composition are partially eliminated from the adjusted measurement L.

16. An apparatus according to claim 15, wherein said purge gas has a refractive index at a wavelength $\lambda_1$ which is substantially the same as that of air when measured at the same wavelength, temperature and pressure.

17. An apparatus according to claim 15, wherein K is given by the equation:

$$K = \frac{(\alpha_{c3} - \alpha_{c2})(\alpha_{c1})\left(\frac{\sigma_\rho}{\rho_0}\right)^2 + (\alpha_{m1} - \alpha_{a1})(\alpha_{m3} - \alpha_{m2} - \alpha_{a3} + \alpha_{a2})\sigma_C^2}{(\alpha_{c3} - \alpha_{c2})^2\left(\frac{\sigma_\rho}{\rho_0}\right)^2 + (\alpha_{m3} - \alpha_{m2} - \alpha_{a3} + \alpha_{a2})^2\sigma_C^2} \tag{22}$$

wherein $\alpha_{mx}$ and $\alpha_{ax}$ represent the refractivity of the purge gas or air respectively at a wavelength $\lambda_x$ and $\alpha_{cx}$ represents the refractivity of air contaminated by a relative amount c of the purge gas at a wavelength $\lambda_x$, $\rho$ represents quotient pressure divided by absolute temperature, $\sigma_\rho$ is the standard deviation of $\rho$ and $\sigma_c$ is the standard deviation of c.

18. An apparatus according to claim 15, wherein the purge gas comprises at least 95% by volume of at least one of Ne and He.

19. An apparatus according to claim 15, wherein the purge gas comprises from 94 to 96% by volume $N_2$ and from 4 to 6% by volume of at least one of Ne and He.

20. An apparatus according to claim 15, wherein $\lambda 1$ is about 633 nm, $\lambda 2$ is about 532 nm and $\lambda 3$ is about 266 nm.

21. An apparatus according to claim 15, wherein said purge gas supply comprises a gas flow regulator to control a rate of flow of purge gas to said space and a pump to remove purge gas from said space.

22. An apparatus according to claim 21 wherein said flow regulator comprises a flow restrictor.

23. An apparatus according to claim 21 wherein said flow regulator comprises a blower.

24. An apparatus according to claim 15, wherein said radiation of said projection beam has a wavelength less than about 180 nm.

25. An apparatus according to claim 24 wherein said radiation of said projection beam has a wavelength selected from the group comprising about 157 nm and about 180 nm.

26. A device manufacturing method comprising:
projecting a patterned beam of radiation onto a target area of a layer of radiation-sensitive material on a substrate;
determining the position of a table using a displacement measuring interferometer having an operating wavelength $\lambda_1$, said table comprising at least one of a substrate holder and a patterning structure;
providing purge gas to a space accommodating at least a part of said table to displace therefrom ambient air, wherein said purge gas is substantially non-absorbent of said patterned beam of radiation and has a refractive index at a wavelength $\lambda_1$ which is substantially the same as that of air when measured at the same wavelength, temperature and pressure.

27. A method according to claim 26, which further comprises adjusting the measurement of said displacement measuring interferometer to substantially eliminate effects of variation in pressure and temperature using a second harmonic interferometer having operating wavelengths $\lambda_2$ and $\lambda_3$; and
wherein said purge gas comprises at least three different components, each component having refractivities at the wavelengths $\lambda_2$ and $\lambda_3$ such that the following equations are substantially fulfilled:

$$\sum_{j}^{k} F_j \alpha_{j1} = \alpha_{a1} \qquad (1)$$

$$\sum_{j}^{k} F_j (\alpha_{j3} - \alpha_{j2}) = \alpha_{a3} - \alpha_{a2} \qquad (2)$$

wherein $F_j$ is a fraction by volume of component j in the purge gas, which purge gas contains a total of k components, $\alpha_{j1}$ is a refractivity of component j at a wavelength $\lambda_1$, $\alpha_{j2}$ is a refractivity of component j at a wavelength $\lambda_2$, $\alpha_{j3}$ is a refractivity of component j at a wavelength $\alpha_3$, $\alpha_{a1}$ is a refractivity of air at a wavelength $\lambda_1$, $\alpha_{a2}$ is a refractivity of air at a wavelength $\lambda_2$ and $\alpha_{a3}$ is a refractivity of air at a wavelength $\lambda_3$, and wherein:

$$\sum_{j}^{k} F_j = 1. \qquad (3)$$

28. A device manufacturing method comprising:
projecting the patterned beam of radiation onto a target area of the layer of radiation-sensitive material,
determining a position of a table using a displacement measuring interferometer having an operating wavelength $\lambda_1$, said table comprising at least one of a substrate holder and a patterning structure;
adjusting a measurement of said displacement measuring interferometer to substantially eliminate effects of variation in pressure and temperature using a second harmonic interferometer having operating wavelengths $\lambda_2$ and $\lambda_3$;
providing purge gas to a space accommodating at least a part of said table to displace therefrom ambient air, wherein said purge gas is substantially non-absorbent of said patterned beam of radiation and comprises at least two components, each component having refractivities at the wavelengths $\lambda_1$, $\lambda_2$ and $\lambda_3$ such that the following equation is substantially fulfilled:

$$\frac{\alpha_{m1}}{(\alpha_{m3} - \alpha_{m2})} = K_a \qquad (4)$$

wherein $\alpha_{m1}$ is a refractivity of the purge gas at a wavelength $\lambda_1$, $\alpha_{m2}$ is a refractivity of the purge gas at a wavelength $\lambda_2$, $\alpha_{m3}$ is a refractivity of the purge gas at a wavelength $\lambda_3$ and $$K_a = \frac{\alpha_{a1}}{(\alpha_{a3} - \alpha_{a2})} \qquad (5)$$

wherein $\alpha_{a1}$ is a refractivity index of air at a wavelength $\lambda_1$, $\alpha_{a2}$ is a refractivity of air at a wavelength $\lambda_2$ and $\alpha_{a3}$ is a refractivity of air at a wavelength $\lambda_3$.

29. A device manufacturing method comprising:
projecting a patterned beam of radiation onto a target area of a layer of radiation-sensitive material on a substrate,
providing purge gas to a space accommodating at least a part of a table to displace therefrom ambient air, said table comprising at least one of a substrate holder and a patterning structure, wherein said purge gas is substantially non-absorbent of said projection beam of radiation;
determining a position of said table using a displacement measuring interferometer having an operating wavelength $\lambda_1$; and
adjusting the measurement of said displacement measuring interferometer (DI) using a second harmonic interferometer having operating wavelengths $\lambda_2$ and $\lambda_3$ according to the following equation:

$$L = (DI) - K(SHI) \qquad (9)$$

wherein L is an adjusted displacement measuring interferometer measurement, SHI is a measurement of the second harmonic interferometer and K is a coefficient, a value of which is optimized such that the effects of variation in pressure, temperature and purge gas composition are partially eliminated from the adjusted value L.

30. A device manufactured according to the method of claim 26.

31. A purge gas as defined in claim 3.

* * * * *